United States Patent [19]

Peternell et al.

[11] Patent Number: 4,589,058
[45] Date of Patent: May 13, 1986

[54] ELECTROLYTIC CAPACITOR

[75] Inventors: Hans Peternell; Rudolf Schnapauff, both of Klagenfurt, Austria

[73] Assignee: U.S. Philips Corporation, New York, N.Y.

[21] Appl. No.: 519,877

[22] Filed: Aug. 3, 1983

[30] Foreign Application Priority Data

Nov. 12, 1982 [AT] Austria ................. 4136/82

[51] Int. Cl.$^4$ ............................................. H01G 9/00
[52] U.S. Cl. ....................................... 361/433; 29/570
[58] Field of Search .................. 361/433, 411, 839; 29/570

[56] References Cited

U.S. PATENT DOCUMENTS

| 3,124,721 | 3/1964 | Rayburn et al. | 361/411 |
| 3,296,505 | 1/1967 | Sparrow et al. | 361/433 |
| 3,516,155 | 6/1970 | Smith | 361/411 X |
| 3,573,566 | 4/1971 | Fournier et al. | 361/433 |
| 4,288,842 | 9/1981 | Voyles | 29/570 X |

Primary Examiner—L. T. Hix
Assistant Examiner—Douglas S. Lee
Attorney, Agent, or Firm—Norman N. Spain

[57] ABSTRACT

An electrolytic capacitor (1) which is accommodated in a cylindrical cup (2) and comprises two connection wires (5, 6) leading away from its two end faces, is accommodated in a continuous cylindrical recess (9) of a prismatic casing (8) consisting of insulating material, in which the connection wires project from said recess at each end and are rolled to form strips (10, 11) which are each given two bends (12, 13) and (14, 15) on one and the same side surface (16) of the casing (FIG. 1).

1 Claim, 3 Drawing Figures

ELECTROLYTIC CAPACITOR

The invention relates to an electrolytic capacitor which is accommodated in a cylindrical cup and comprises two coaxial connection wires leading away from its two end faces. A variety of constructions of such electrolytic capacitors are known, either as dry or as wet electrolytic capacitors. Such an embodiment is shown, for example, in the DE-AS No. 24.38.870.

It is the object of the invention to construct such an electrolytic capacitor so that it can also be used in a simple manner in a recumbent position in circuit groups, for example in thick film circuits or on circuit boards. According to the invention this is achieved in that the cup is surrounded by a prismatic casing consisting of an insulating material which has a continuous cylindrical recess in which the cup is accommodated and from which the two connection wires project at each end, that the connection wires projecting from the casing are rolled to form strips and that said strips, by being bent-over two times, are both turned down on one and the same side surface of the casing, their ends on said side surface being situated at a distance from each other. In this manner it is not necessary to manufacture a specially constructed electrolytic capacitor for the special use of the electrolytic capacitor in a recumbent position, but the electrolytic capacitors obtained in the normal production process can simply be adapted hereto, which involves a considerable relief in the production.

It is to be noted that it is already known from U.S. Pat. No. 3,124,721 to flatten an electric component during its production starting from a cylindrical shape so that it obtains a flat surface, and to bend-over the two connection foils so that their end faces end on one of these surfaces. As may be seen, a special original product is manufactured, in contrast with the present invention, in which a product which is already substantially ready for the special end in view, is adapted. It is also known per se, as shown in U.S. Pat. No. 3,516,155 in a cylindrical electrical component, to bend-over the two connection wires at the end faces two times in opposite directions and provide them with flattened ends to so produce flat surfaces for the component. Such comparatively small and weak surfaces, however, do not ensure a reliable and stable position of the component.

The invention will not be described in greater detail with reference to the drawing which shows an embodiment of the invention to which, however, it should not be restriced.

Figure 1:
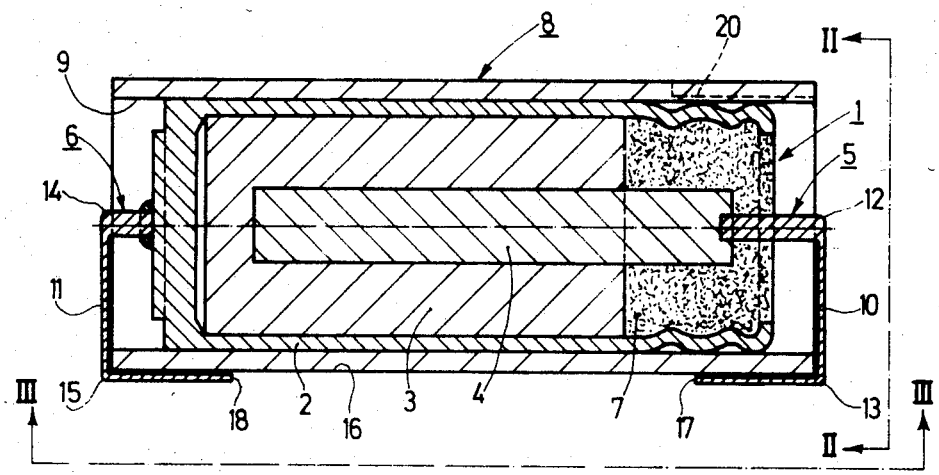
FIG. 1 is a longitudinal sectional view of an electrolytic capacitor.

As may be seen especially from FIG. 1 the actual electrolytic capacitor 1 comprises a cup 2 in which the wound member 3 is accommodated. Said wound member 3 is in electrically conductive contact at the circumference with the inner wall of the cup 2 which in the usual manner consists of electrically conductive material, it being also possible, of course, to produce said contacting in a different manner. An electrically conductive connection strip or pin 4 is provided in the interior of the wound member 3 for contacting the other electrode, to which strip or pin on the other hand a connection wire 5 is connected which leads away from the electrolytic capacitor 1 at the end face. From the bottom of the cup 2 which forms the other end face of the electrolytic capacitor, a second connection wire 6 is led out which is electrically conductively connected to the bottom of the cup. A plug 7 which consists of an elastic gum material serves to seal the electrolytic capacitor and is provided in the opening of the cup and is held therein by flanging of the edge of the cup and squeezing the cup. The connection strip or pin 4 and the connection wire 5 are passed through said plug 7. Within the scope of the prior art, of course, other types of seals for the electrolytic capacitor are also possible. Such an electrolytic capacitor 1 is a usual product which is generally commerially available.

In order to adapt such an electrolytic capacitor 1 for a satisfactory use as a recumbent component, a preferably square casing 8 consisting of insulating material is provided which surrounds the cup 2. For this purpose the casing 8 has a continuous cylindrical recess 9 in which the electrolytic capacitor 1 with the cup 2 is accommodated and from which the two connections wires 5 and 6 project at each end. The cross-sectional shape of the recess 9 may be chosen to be circular or polygonal. The circumferential cross-sectional shape of the casing 8 may also be polygonal, for example pentagonal. Such a casing 8 may be manufactured as a separate component from a synthetic resin, in the recess of which the electrolytic capacitor 1 with its cup 2 is inserted. However, the casing 8 may also be manufactured in that the electrolytic capacitor 1 is immediately embedded in synthetic resin in a suitable mould.

Furthermore, the connection wires 5 and 6 projecting from the recess 9 of the casing 8 are rolled to form strips 10 and 11, respectively, and these strips 10 and 11 are then fiven two bends 12, 13 and 14, 15, respectively, each on one and the same side surface 16 of the casing 8, in which, by suitable cutting to length of the strips 10 and 11, their ends 17 and 18, respectively, on said side surface 16 are situated at a distance from each other. The bends 12, 13 and 14, 15, respectively are produced in such manner that the strips 10 and 11, respectively, engage the casing 8 under prestress, so that its position is ensured. Such ensurance of position of the strips 10 and 11, respectively, could of course also be carried out in any other manner, for example in that the strip section present against the side surface 16 of the casing 8 is bonded to said surface. Of course, the rolling of the connection wires to form strips could also be carried out prior to providing the casing 8 around the electrolytic capacitor 1.

Such an adapted electrolytic capacitor is very readily suitable for use as a recumbent component in a circuit group since as a result of the prismatic shape of the casing a side surface thereof forms a stable surface and the connection wires rolled to form strips enable a good contacting after bending said strips on the side surface in question of the casing. The production of such an electrolytic capacitor is particularly simple since the electrolytic capacitors manufactured in a usual production process are only to be developed further in the above-described manner.

Figure 3:
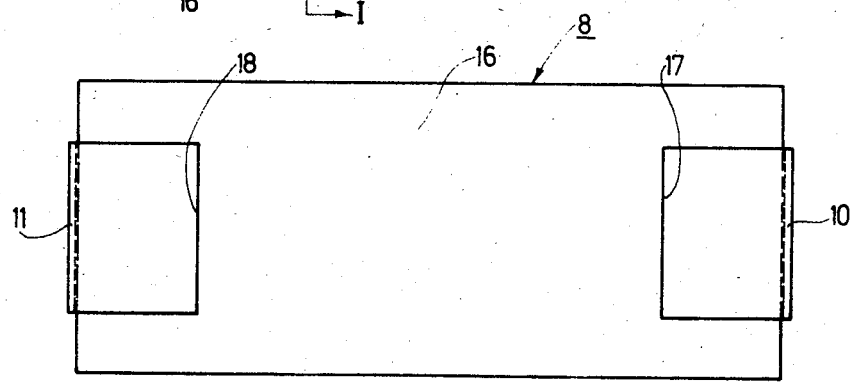
FIG. 3 is a side elevation of the electrolytic capacitor shown in FIG. 1 taken on the line III—III of FIG. 1.

As shown in FIG. 3 the strip sections engaging the side surface 16 of the casing in the present example, viewed in the longitudinal direction, are in alignment. By a corresponding shape of the strips 10 and 11, respectively, however, it can also be achieved that the strip sections engaging the side surface 16 of the casing 8, viewed in the transverse direction, extend at a distance from each other and hence, viewed in the longitudinal direction, are not in alignment which may desirable with a view to the electric connection possibilities.

Figure 2:
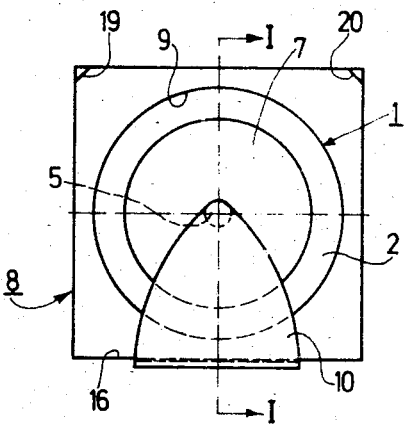
FIG. 2 is a side elevation of the electrolytic capacitor shown in FIG. 1 taken on the line II—II of FIG. 1.

The casing 8 is preferably provided at its end face with at least one, preferably machine-scannable, mark to characterize the polarity of the electrolytic capacitor. In the present case, as shown in particular in FIG. 2, the signs of the casing 8 opposite to the side surface 16 are for this purpose provided partly with bevels 19 and 20, respectively.

If desired, the two ends of the recess 9 in the casing 8 which is open laterally can be filled with an insulating moulding mass which may contribute to an improvement of the insulation properties.

It will be obvious from the above that there numerous modifications of the example described are possible without therefor departing from the scope of this invention.

What is claimed is:

1. Electrolytic capacitor provided with an electrically conductive cylindrical cup with two end faces from which two coaxial connection wires extend, characterized in that said cup is surrounded by a prismatic casing consisting of an insulating material, which prismatic casing is provided with a continuous cylindrical recess, that each of said connection wires projects from each end of said casing and that said connection wires projecting from said casing are strip shaped and bent over to lie along the same side surface of said casing, the ends of said strips being situated at a distance from each other.

* * * * *